(12) United States Patent
Harnik et al.

(10) Patent No.: US 8,686,881 B1
(45) Date of Patent: Apr. 1, 2014

(54) EFFICIENT ESTIMATION OF DATA COMPRESSION RATIOS

(71) Applicant: International Business Machines Corporation, Armonk, NY (US)

(72) Inventors: Danny Harnik, Tel Mond (IL); Dmitry Sotnikov, Givataim (IL); Avishay Traeger, Jerusalem (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/732,449

(22) Filed: Jan. 2, 2013

(51) Int. Cl.
*H03M 7/30* (2006.01)
(52) U.S. Cl.
USPC .............................................. 341/87; 341/51
(58) Field of Classification Search
USPC ...................................................... 341/87, 51
See application file for complete search history.

(56) References Cited

U.S. PATENT DOCUMENTS

| | | | | |
|---|---|---|---|---|
| 5,870,036 | A | * | 2/1999 | Franaszek et al. .............. 341/51 |
| 6,577,254 | B2 | * | 6/2003 | Rasmussen .................... 341/51 |
| 7,378,992 | B2 | * | 5/2008 | Fallon .............................. 341/51 |
| 2004/0230724 | A1 | | 11/2004 | Stager et al. |
| 2011/0082842 | A1 | | 4/2011 | Groseclose, Jr. et al. |

* cited by examiner

*Primary Examiner* — Khai M Nguyen
(74) *Attorney, Agent, or Firm* — F. Jason Farhadrar, Esq.; Century IP Group

(57) ABSTRACT

Machines, systems and methods for compression ratio estimation are provided. The method comprises selecting a plurality of sample points in a data stream to compress sample data selected at said sample points according to a first compression method; and computing an average compression ratio contribution over the selected plurality of sample points, wherein compression ratio contribution of a sample point is determined based on the first compression method and data in locality of the sample point, and wherein the locality for the sample point is defined by locations in the data stream, such that said locations potentially affect the sample point's contribution to the compression ratio.

20 Claims, 6 Drawing Sheets

EFFICIENT ESTIMATION OF DATA COMPRESSION RATIOS

COPYRIGHT & TRADEMARK NOTICES

A portion of the disclosure of this patent document may contain material, which is subject to copyright protection. The owner has no objection to the facsimile reproduction by any one of the patent document or the patent disclosure, as it appears in the Patent and Trademark Office patent file or records, but otherwise reserves all copyrights whatsoever.

Certain marks referenced herein may be common law or registered trademarks of the applicant, the assignee or third parties affiliated or unaffiliated with the applicant or the assignee. Use of these marks is for providing an enabling disclosure by way of example and shall not be construed to exclusively limit the scope of the disclosed subject matter to material associated with such marks.

TECHNICAL FIELD

The disclosed subject matter relates generally to data compression technology.

BACKGROUND

Data compression involves reducing the size of data by way of applying a data compression technique to target data. Data compression is advantageous in certain scenarios and environments. For example, video content may be compressed so that the video data can be transmitted faster over a communications network that has a limited bandwidth.

Certain types of content are less successfully compressible than others. For example, compressing data content that is encrypted or has been previously compressed is generally not an efficient use of resources, because that data may not be compressed much further. That is, if compressing a target dataset does not result in reasonable savings, then resources utilized for compressing the dataset would be deemed wasted.

It would be very useful to accurately determine the level of savings that may be achieved via data compression before actually allocating and utilizing the respective computing resources to compress the data. If the level of data compression that is achievable is known in advance, one can more efficiently predict the amount of storage needed to store the to be compressed data and can further allocate the computing resources to compress only those data that can be more optimally compressed.

SUMMARY

For purposes of summarizing, certain aspects, advantages, and novel features have been described herein. It is to be understood that not all such advantages may be achieved in accordance with any one particular embodiment. Thus, the disclosed subject matter may be embodied or carried out in a manner that achieves or optimizes one advantage or group of advantages without achieving all advantages as may be taught or suggested herein.

In accordance with one embodiment, a method for compression ratio estimation is provided. The method comprises selecting a plurality of sample points in a data stream to compress sample data selected at said sample points according to a first compression method; and computing an average compression ratio contribution over the selected plurality of sample points, wherein compression ratio contribution of a sample point is determined based on the first compression method and data in locality of the sample point, and wherein the locality for the sample point is defined by locations in the data stream, such that said locations potentially affect the sample point's contribution to the compression ratio.

In accordance with one or more embodiments, a system comprising one or more logic units is provided. The one or more logic units are configured to perform the functions and operations associated with the above-disclosed methods. In yet another embodiment, a computer program product comprising a computer readable storage medium having a computer readable program is provided. The computer readable program when executed on a computer causes the computer to perform the functions and operations associated with the above-disclosed methods.

One or more of the above-disclosed embodiments in addition to certain alternatives are provided in further detail below with reference to the attached figures. The disclosed subject matter is not, however, limited to any particular embodiment disclosed.

BRIEF DESCRIPTION OF THE DRAWINGS

The disclosed embodiments may be better understood by referring to the figures in the attached drawings, as provided below.

Features, elements, and aspects that are referenced by the same numerals in different figures represent the same, equivalent, or similar features, elements, or aspects, in accordance with one or more embodiments.

DETAILED DESCRIPTION OF EXAMPLE EMBODIMENTS

Figure 1:
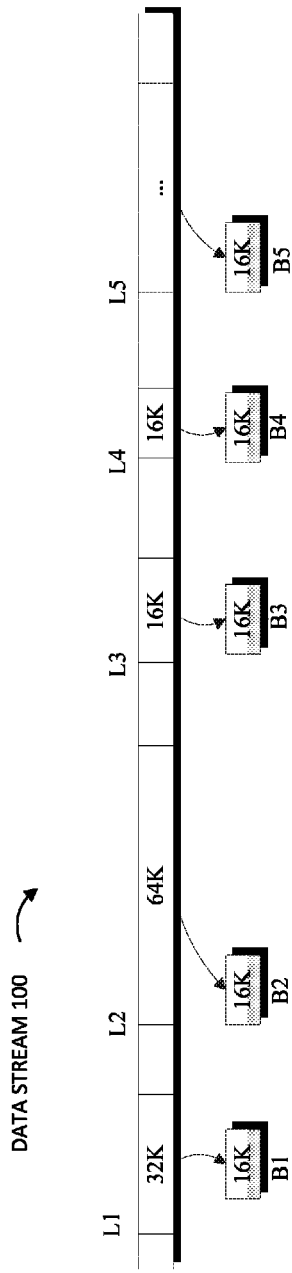
FIG. 1 illustrates an exemplary data stream that is sampled for the purpose of compression estimation, in accordance with one or more embodiments.

In the following, numerous specific details are set forth to provide a thorough description of various embodiments. Certain embodiments may be practiced without these specific details or with some variations in detail. In some instances, certain features are described in less detail so as not to obscure other aspects. The level of detail associated with each of the elements or features should not be construed to qualify the novelty or importance of one feature over the others.

In accordance with one embodiment, estimation methods are implemented that, when applied to a target dataset in uncompressed format, provide for a quick and accurate estimation of the potential gain of compression of the dataset. The estimation methods sample a small number of blocks of data from the target volume and apply a compression procedure to the samples. Depending on implementation, an average of the compression ratios for the sampled data is calculated to determine an accurate estimation of the compression rate for the entire dataset.

A target data volume may be a block device. Contribution of a byte may be defined as the size of an input block it belongs to divided by the length of the compressed representation of this block. In such a case, m blocks may be sampled at a random start location in each block. In the case that all zero blocks are not allocated (i.e., thin provisioning) and therefore not compressed, then each block is read, checked to be not all zeros and then added as a sample. The result would be the collection of m non-zero blocks.

In a scenario where the data targeted for compression is arranged in files, samples may be selected in a way that each byte in each buffer gets an equal probability. This may be achieved by assigning a probability factor (e.g., flipping a coin) for each byte that outputs a yes with probability p=m/(total number of bytes in data set). Such a choice may be implemented by looking at the length of each file and taking the file into consideration if the output of a binomial random variable B(length_of_file, p) is at least 1.

It is desirable to determine the optimum number of samples needed that can provide ascertain level estimation accuracy without overburdening the estimation process with too many samples. To accomplish the above, the total compression ratio as an average of the compression ratio of a byte in the data set is considered. Since data bytes are not compressed independently and there is no meaning to the compression ratio of a single byte, the contribution of one or more input bytes to the output of the compressed stream as an average of the compression rate in its locality may be determined.

The contribution of each byte is dictated by its surroundings in the input stream. In one implementation, contribution denotes the contribution of the $i^{th}$ byte in the target volume and may be defined so that the overall compression ratio is presented in the following form:

$$\text{Compression Ratio} = \frac{1}{n}\sum_{i=0}^{n-1} \text{contribution}_i$$

For example, a string that has not appeared before will have a contribution equal to 1, but a repeating stream will have a lower contribution ratio. The choice of the parameter m is based on the level of accuracy desired. That is, the higher the value of m, the more the number of the samples and therefore the higher the probability of obtaining more accurate results. The so called Hoeffding Inequality formula may be used in one embodiment to quantify the accuracy in the same way as one would use it to estimate the average of samples over a population. The number of samples that may be used in the sampling mechanism as a function of the accuracy and confidence parameters may be determined based on the following formula:

$$m \geq \frac{1}{2 \cdot \text{Accuracy}^2} \ln\left(\frac{2}{\text{Confidence}}\right)$$

For the above accuracy analysis to be meaningful, in some embodiments, estimation methods may be applied to compression methods that have bounded locality. That is, the compressed representation of sampled output data may be created by looking at a bounded number of input bytes, where the size of the bound on input blocks is well-defined in advance. Each byte in the input may be eventually represented by some string in the output.

For example, if a string of length 100 bytes is represented by 5 compressed bytes, then the contribution of each of the uncompressed 100 bytes is 5/100=1/20. On the other hand, if 10 uncompressed bytes are represented by 10 bytes after the compression is applied, then the contribution of each byte is 1. As such, the overall compression ratio is the average of the contributions of each uncompressed byte. For example, in a real-time compression method, in order to support performance, one may limit how far output data may point to each other. When there is a systematic close of an output stream and an initialization of a new stream, then the estimation method may be applied.

By way of example, referring to FIGS. 1, a data stream 100 is illustrated which may be compressed using a compression algorithm. Prior to compressing the data, it would be desirable to know whether a reasonable or a certain level of compression may be achieved. In this manner, it may be determined whether it is worthwhile to allocate the needed resources to perform the compression. To estimate the level of compression, one or more sampling schemes may be used as provided in further detail below.

Figure 2:
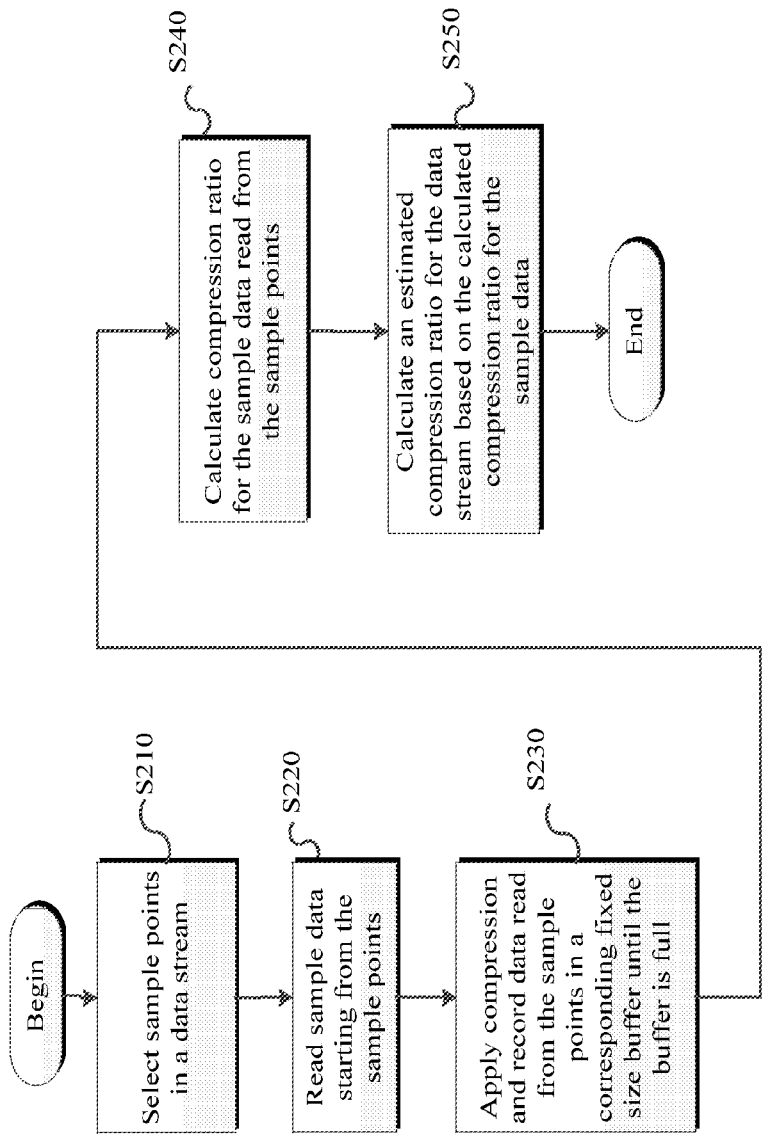
FIG. 2 is a flow diagram of an exemplary method of estimating the compression ratio for a data stream, in accordance with one embodiment.

Referring to FIGS. 1 and 2, m locations (e.g., L1, L2, L3, L4, L5) in data stream 100 may be selected as sample points in the data stream 100 from which sample data may be read (S210). The sample points may be selected either at random or according to a predetermined function or heuristic, depending on implementation. Starting from a sample point in data stream 100, sample data may be read such that, for example, sample data S1 is read starting from sample point L1 and sample data S2 is read starting from sample point L2 and so on (S220).

The sample data read starting from a sample point (e.g., L1) may be compressed according to a compression algorithm and recorded into a corresponding fixed-size buffer (e.g., B1) until the corresponding buffer is full (S230). As shown in FIG. 1, this process may be applied to one or more sample points (e.g., L1, L2, L3, L4, L5) and the data read beginning from said sample points may be compressed and stored in corresponding fixed-size buffers (e.g., B1, B2, B3, B4, B5) until one or more buffers are full. In one embodiment, the reading of data and compressing process continues until each buffer is full.

Once a fixed-size buffer corresponding to a sample point is full, the compression ratio for the sample data read starting from the respective sample point may be calculated (S240). In one embodiment, compression ratios for sample data read from selected sample points may be determined by dividing the size of the fixed-size buffer (e.g., 16) by the volume of data read starting from a sample point. That is, in one exemplary embodiment, the compression ratio of sampled data may be determined according to the following equation: r=(length of output buffer)/(length of input data read).

For example, as shown in FIG. 1, sample data read starting at sample point L1 may be compressed such that 32K bytes of sample data is compressed into a first 16K-byte buffer B1. In this example, a compression ratio of 16/32 or 0.5 is achieved for the first data sample read starting at sample point L1. The higher the number of samples, and the more random the sampling, the more likely it is that the calculated compression ratio is an accurate estimation of what the actual compression ratio would be for the target portion of a data stream.

Once the compression ratio for a plurality of sample data is determined, an estimated compression ratio for the data stream 100 may be calculated based on the calculated compression ratio for the plurality of sample data. For example, the estimated compression ratio may be determined by calculating the average of the compression ratios for all samples:

$r=(r_1+r_2+r_3+\ldots+r_m)/m$ (S250). This calculated average value would thus provide an estimate for the compression ratio that may be expected if the entire dataset in data stream 100 is compressed, without having to compress the entire dataset first.

Continuing the example in FIG. 1, data read starting at sample point L2 may be compressed such that 64K bytes of sample data is compressed into a second 16K-byte buffer B2. In this example, a compression ratio of 16/64 or 0.25 is achieved for the second sample data read starting at L2. Third and fourth samples from L3 and L4 may generate a result of 16/16=1 each, since the data in those tow samples cannot be compressed, in this example. The average of the four samples [(0.5+0.25+1+1)/4] taken together would provide an estimated compression ratio of 0.68 for the target dataset in the range L1 to L5.

Figure 3:
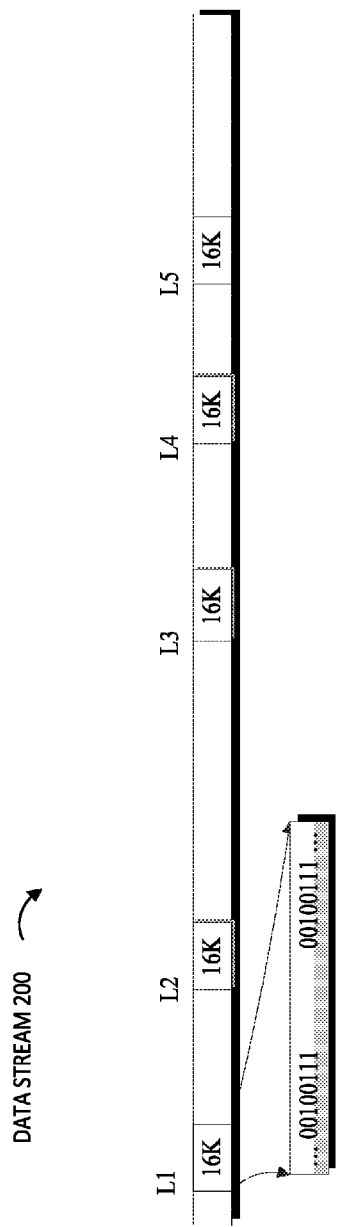
FIG. 3 illustrates another exemplary sampling technique in accordance with one or more embodiments.
Figure 4:
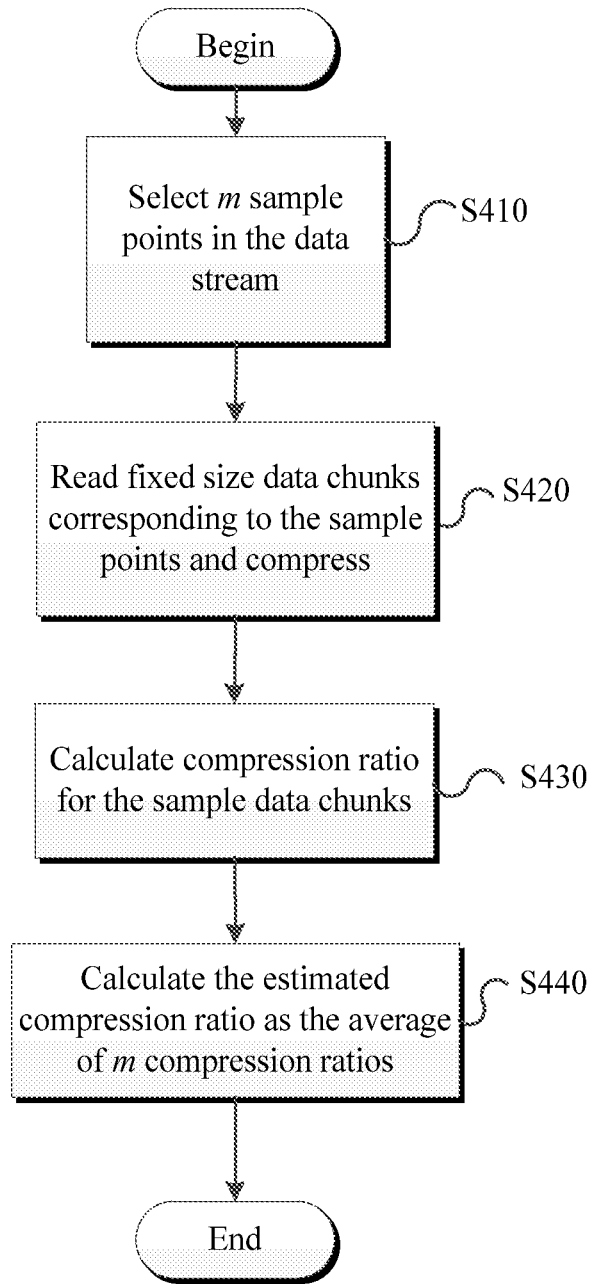
FIG. 4 is a flow diagram of another exemplary method of estimating the compression ratio for a data stream, in accordance with one embodiment.

Referring to FIGS. 3 and 4, in one embodiment, an alternative estimation scheme may be used to predict the compression ratio for a data stream 200 by selecting m sample points in the data stream 200 (S410) and selecting fixed-size data chunks in association with (e.g., starting from) multiple sample points in data stream 200. Depending on implementation, some or all the selected fixed-sized data chunks may be read and compressed (S420). The compression ratio for a sampled data chunk may be calculated by dividing the size of the compressed sample to the size of the sample prior to compression.

Once the compression ratios for the plurality of the sample points are determined, the estimated compression ratio for the data stream 200 may be determined as the average of the sampled compression ratios of the m samples (S440). For example, consider m=5 and 16K byte fixed size data samples read and compressed separately for 5 sample points L1, L2, L3, L4 and L5. For the sample at location L1, if after compression its size is 5K-byte, then the first sampled compression ratio at L1 may be calculated as: $r1=5/16=0.3125$.

The above process may be repeated for the remaining data samples taken at L2, L3, L4 and L5 to determine the number of occurrences of the target string in the corresponding fixed-size samples at L2, L3, L4 and L5. The samples are processed so that the respective compression ratio for, preferably, each of the samples is computed. The average of the compression ratios calculated for the plurality of the fixed-size samples would yield an estimated compression ratio for the target portion of data stream 200 in the range identifiable by L1 to L5.

In one embodiment, a variation of the above sampling methods may be utilized to determine the estimated compression ratio for a data stream. Depending on implementation, once the sample points in the data stream are selected, for a sample point L1, for example, a fixed data chunk ending with sample point L1 (e.g. the leading 32 KB of data until L1 is reached) is selected and compressed.

In addition, the next X bytes (e.g., 256 bytes) following the sample point L1 are read and compressed. The number of bytes needed to compress these last X bytes is determined. The compression ratio for point L1 may be calculated according to the following formula: $r1=$(compressed size of last X bytes)/X. In the above example, the locality is comprised of the previous 32 KB plus the following 256 bytes. The contribution in this instance is defined by the representation length of the last 256 bytes when compressing all of the locality.

In compression environments in which the target of compression includes individual data files, the estimation techniques disclosed above may be extended to determine the average compression ratio for the data files, with the consideration that a larger file is more likely to be have samples taken from it than a smaller file, a property that ensures accurate estimation over the entire data. In this manner, the sampling would be more equitable for each file with respect to the file size and the estimation results would more accurately reflect the true compression ratio for the files taken together.

References in this specification to "an embodiment", "one embodiment", "one or more embodiments" or the like, mean that the particular element, feature, structure or characteristic being described is included in at least one embodiment of the disclosed subject matter. Occurrences of such phrases in this specification should not be particularly construed as referring to the same embodiment, nor should such phrases be interpreted as referring to embodiments that are mutually exclusive with respect to the discussed features or elements.

In different embodiments, the claimed subject matter may be implemented as a combination of both hardware and software elements, or alternatively either entirely in the form of hardware or entirely in the form of software. Further, computing systems and program software disclosed herein may comprise a controlled computing environment that may be presented in terms of hardware components or logic code executed to perform methods and processes that achieve the results contemplated herein. Said methods and processes, when performed by a general purpose computing system or machine, convert the general purpose machine to a specific purpose machine.

Figure 5A:
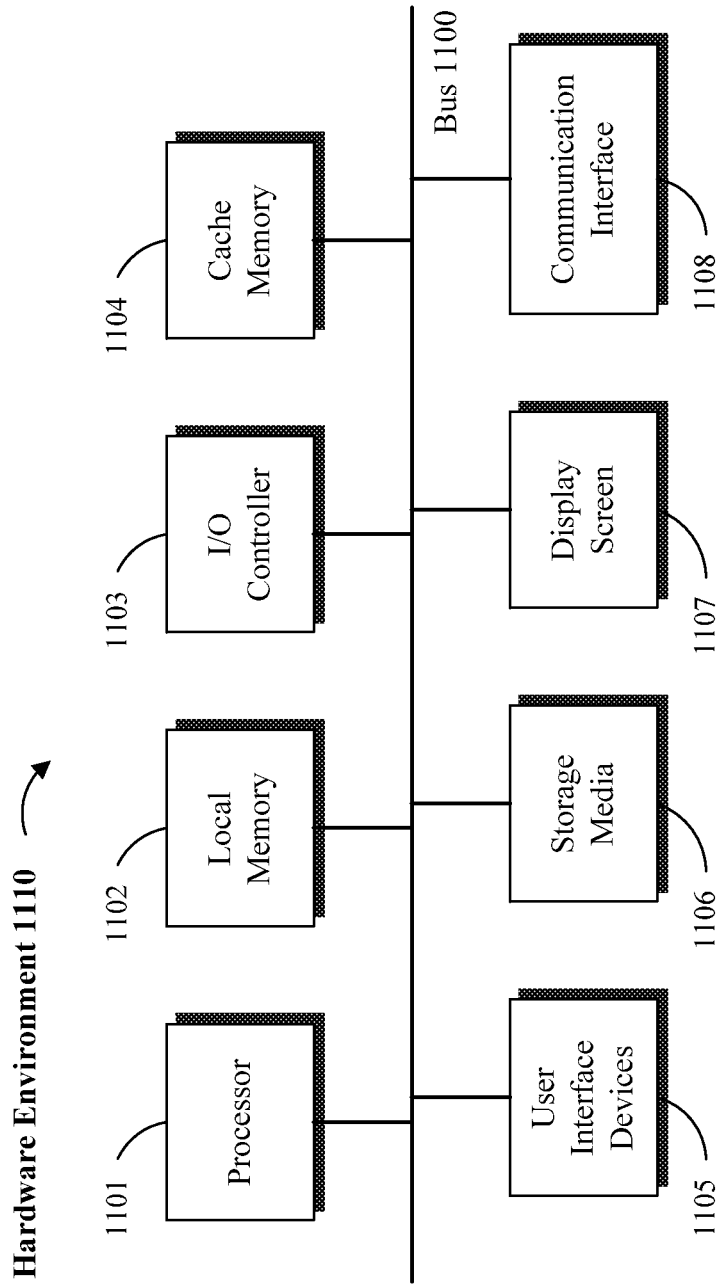
FIGS. 5A and 5B are block diagrams of hardware and software environments in which the disclosed systems and methods may operate, in accordance with one or more embodiments.
Figure 5B:
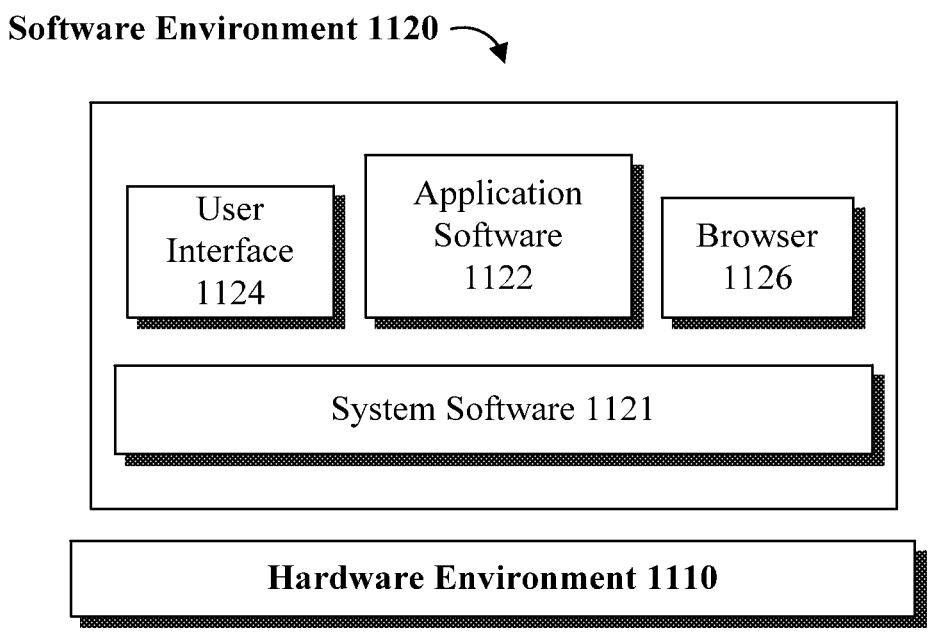

Referring to FIGS. 5A and 5B, a computing system environment in accordance with an exemplary embodiment may be composed of a hardware environment 1110 and a software environment 1120. The hardware environment 1110 may comprise logic units, circuits or other machinery and equipments that provide an execution environment for the components of software environment 1120. In turn, the software environment 1120 may provide the execution instructions, including the underlying operational settings and configurations, for the various components of hardware environment 1110.

Referring to FIG. 5A, the application software and logic code disclosed herein may be implemented in the form of machine readable code executed over one or more computing systems represented by the exemplary hardware environment 1110. As illustrated, hardware environment 110 may comprise a processor 1101 coupled to one or more storage elements by way of a system bus 1100. The storage elements, for example, may comprise local memory 1102, storage media 1106, cache memory 1104 or other machine-usable or computer readable media. Within the context of this disclosure, a machine usable or computer readable storage medium may include any recordable article that may be utilized to contain, store, communicate, propagate or transport program code.

A computer readable storage medium may be an electronic, magnetic, optical, electromagnetic, infrared, or semiconductor medium, system, apparatus or device. The computer readable storage medium may also be implemented in a propagation medium, without limitation, to the extent that such implementation is deemed statutory subject matter. Examples of a computer readable storage medium may include a semiconductor or solid-state memory, magnetic tape, a removable computer diskette, a random access memory (RAM), a read-only memory (ROM), a rigid magnetic disk, an optical disk, or a carrier wave, where appropriate. Current examples of optical disks include compact disk, read only memory (CD-ROM), compact disk read/write (CD-R/W), digital video disk (DVD), high definition video disk (HD-DVD) or Blue-ray™ disk.

In one embodiment, processor 1101 loads executable code from storage media 1106 to local memory 1102. Cache memory 1104 optimizes processing time by providing temporary storage that helps reduce the number of times code is loaded for execution. One or more user interface devices 1105 (e.g., keyboard, pointing device, etc.) and a display screen 1107 may be coupled to the other elements in the hardware environment 1110 either directly or through an intervening I/O controller 1103, for example. A communication interface unit 1108, such as a network adapter, may be provided to enable the hardware environment 1110 to communicate with local or remotely located computing systems, printers and storage devices via intervening private or public networks (e.g., the Internet). Wired or wireless modems and Ethernet cards are a few of the exemplary types of network adapters.

It is noteworthy that hardware environment 1110, in certain implementations, may not include some or all the above components, or may comprise additional components to provide supplemental functionality or utility. Depending on the contemplated use and configuration, hardware environment 1110 may be a machine such as a desktop or a laptop computer, or other computing device optionally embodied in an embedded system such as a set-top box, a personal digital assistant (PDA), a personal media player, a mobile communication unit (e.g., a wireless phone), or other similar hardware platforms that have information processing or data storage capabilities.

In some embodiments, communication interface 1108 acts as a data communication port to provide means of communication with one or more computing systems by sending and receiving digital, electrical, electromagnetic or optical signals that carry analog or digital data streams representing various types of information, including program code. The communication may be established by way of a local or a remote network, or alternatively by way of transmission over the air or other medium, including without limitation propagation over a carrier wave.

As provided here, the disclosed software elements that are executed on the illustrated hardware elements are defined according to logical or functional relationships that are exemplary in nature. It should be noted, however, that the respective methods that are implemented by way of said exemplary software elements may be also encoded in said hardware elements by way of configured and programmed processors, application specific integrated circuits (ASICs), field programmable gate arrays (FPGAs) and digital signal processors (DSPs), for example.

Referring to FIG. 5B, software environment 1120 may be generally divided into two classes comprising system software 1121 and application software 1122 as executed on one or more hardware environments 1110. In one embodiment, the methods and processes disclosed here may be implemented as system software 1121, application software 1122, or a combination thereof. System software 1121 may comprise control programs, such as an operating system (OS) or an information management system, that instruct one or more processors 1101 (e.g., microcontrollers) in the hardware environment 1110 on how to function and process information. Application software 1122 may comprise but is not limited to program code, data structures, firmware, resident software, microcode or any other form of information or routine that may be read, analyzed or executed by a processor 1101.

In other words, application software 1122 may be implemented as program code embedded in a computer program product in form of a machine-usable or computer readable storage medium that provides program code for use by, or in connection with, a machine, a computer or any instruction execution system. Moreover, application software 1122 may comprise one or more computer programs that are executed on top of system software 1121 after being loaded from storage media 1106 into local memory 1102. In a client-server architecture, application software 1122 may comprise client software and server software. For example, in one embodiment, client software may be executed on a client computing system that is distinct and separable from a server computing system on which server software is executed.

Software environment 1120 may also comprise browser software 1126 for accessing data available over local or remote computing networks. Further, software environment 1120 may comprise a user interface 1124 (e.g., a graphical user interface (GUI)) for receiving user commands and data. It is worthy to repeat that the hardware and software architectures and environments described above are for purposes of example. As such, one or more embodiments may be implemented over any type of system architecture, functional or logical platform or processing environment.

It should also be understood that the logic code, programs, modules, processes, methods and the order in which the respective processes of each method are performed are purely exemplary. Depending on implementation, the processes or any underlying sub-processes and methods may be performed in any order or concurrently, unless indicated otherwise in the present disclosure. Further, unless stated otherwise with specificity, the definition of logic code within the context of this disclosure is not related or limited to any particular programming language, and may comprise one or more modules that may be executed on one or more processors in distributed, non-distributed, single or multiprocessing environments.

As will be appreciated by one skilled in the art, a software embodiment may include firmware, resident software, microcode, etc. Certain components including software or hardware or combining software and hardware aspects may generally be referred to herein as a "circuit," "module" or "system." Furthermore, the subject matter disclosed may be implemented as a computer program product embodied in one or more computer readable storage medium(s) having computer readable program code embodied thereon. Any combination of one or more computer readable storage medium(s) may be utilized. The computer readable storage medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing.

In the context of this document, a computer readable storage medium may be any tangible medium that can contain, or store a program for use by or in connection with an instruction execution system, apparatus, or device. A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable storage medium may be transmitted using any appropriate medium, including but not limited to wireless, wireline, optical fiber cable, RF, etc., or any suitable combination of the foregoing. Computer program code for carrying out the disclosed operations may be written in any combination of one or more programming languages, including an object oriented programming language such as Java, Smalltalk, C++ or the like and conventional procedural programming languages, such as the "C" programming language or similar programming languages.

The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Certain embodiments are disclosed with reference to flowchart illustrations or block diagrams of methods, apparatus (systems) and computer program products according to embodiments. It will be understood that each block of the flowchart illustrations or block diagrams, and combinations of blocks in the flowchart illustrations and/or block diagrams, can be implemented by computer program instructions. These computer program instructions may be provided to a processor of a general purpose computer, a special purpose machinery, or other programmable data processing apparatus to produce a machine, such that the instructions, which execute via the processor of the computer or other programmable data processing apparatus, create means for implementing the functions or acts specified in the flowchart or block diagram block or blocks.

These computer program instructions may also be stored in a computer readable storage medium that can direct a computer, other programmable data processing apparatus, or other devices to function in a particular manner, such that the instructions stored in the computer readable storage medium produce an article of manufacture including instructions which implement the function or act specified in the flowchart or block diagram block or blocks.

The computer program instructions may also be loaded onto a computer, other programmable data processing apparatus, or other devices to cause a series of operational steps to be performed on the computer, other programmable apparatus or other devices to produce a computer or machine implemented process such that the instructions which execute on the computer or other programmable apparatus provide processes for implementing the functions or acts specified in the flowchart or block diagram block or blocks.

The flowchart and block diagrams in the figures illustrate the architecture, functionality, and operation of possible implementations of systems, methods and computer program products according to various embodiments. In this regard, each block in the flowchart or block diagrams may represent a module, segment, or portion of code, which comprises one or more executable instructions for implementing the specified logical functions. It should also be noted that, in some alternative implementations, the functions noted in the block may occur in any order or out of the order noted in the figures.

For example, two blocks shown in succession may, in fact, be executed substantially concurrently, or the blocks may sometimes be executed in the reverse order, depending upon the functionality involved. It will also be noted that each block of the block diagrams or flowchart illustration, and combinations of blocks in the block diagrams or flowchart illustration, may be implemented by special purpose hardware-based systems that perform the specified functions or acts, or combinations of special purpose hardware and computer instructions.

The claimed subject matter has been provided here with reference to one or more features or embodiments. Those skilled in the art will recognize and appreciate that, despite of the detailed nature of the exemplary embodiments provided here, changes and modifications may be applied to said embodiments without limiting or departing from the generally intended scope. These and various other adaptations and combinations of the embodiments provided here are within the scope of the disclosed subject matter as defined by the claims and their full set of equivalents.

What is claimed is:

1. A computer-implemented method for compression ratio estimation, the method comprising:
    selecting a plurality of sample points in a data stream to compress sample data selected at said sample points according to a first compression method; and
    computing an average compression ratio contribution over the selected plurality of sample points,
        wherein compression ratio contribution of a sample point is determined based on the first compression method and data in locality of the sample point, and
        wherein the locality for the sample point is defined by locations in the data stream, such that said locations potentially affect the sample point's contribution to the compression ratio.

2. The method of claim 1, wherein the locality is defined by compressing into a fixed-size buffer, the sample data read from a sample point from among the plurality of sample points, until the fixed-size buffer is full, the method further comprising:
    continuing the compressing into a fixed-size buffer for additional sample data read from at least another sample point;
    calculating compression ratios for the sample data read from the sample points; and
    calculating an estimated compression ratio for the data stream based on the calculated compression ratios for the sample data.

3. The method of claim 1, wherein the locality is defined by compressing fixed-size sample data read from one or more of the plurality of sample points, wherein the fixed-size is the same for all of the sample points, the method further comprising:
    calculating one or more compression ratios for one or more sample data read from one or more of the plurality of sample points; and
    calculating an estimated compression ratio for the data stream based on the calculated compression ratios for the one or more sample data.

4. The method of claim 2, wherein the compression ratio for sample data read from a sample point is calculated by dividing size of the fixed-size buffer by size of the data read from the sample point.

5. The method of claim 2, wherein the estimated compression ratio for the data stream is calculated by determining the average compression ratio for at least two of the sample points from among said plurality of sample points.

6. The method of claim 3, wherein the estimated compression ratio for the data stream is calculated by determining the average compression ratio for at least two of the sample points from among said plurality of sample points.

7. The method of claim 1, wherein the sample data for a sample point in the data stream is read starting from an offset from the sample point.

8. The method of claim 1, wherein the data stream is recorded on a data storage medium in block format.

9. The method of claim 8 wherein the plurality of sample points are selected at a random start location in a plurality of corresponding blocks.

10. The method of claim 1, wherein the data stream is recorded on a data storage medium in file format, wherein the plurality of sample points are selected in a way that there is an equal probability that a sample point is selected from each byte in each file.

11. A system comprising one or more processors for enhancing performance in a multicasting system, the system comprising:
   a logic unit for selecting a plurality of sample points in a data stream to compress sample data selected at said sample points according to a first compression method; and
   a logic unit for computing an average compression ratio contribution over the selected plurality of sample points,
   wherein compression ratio contribution of a sample point is determined based on the first compression method and data in locality of the sample point, and
   wherein the locality for the sample point is defined by locations in the data stream, such that said locations potentially affect the sample point's contribution to the compression ratio.

12. The system of claim 11, wherein the locality is defined by compressing into a fixed-size buffer, the sample data read from a sample point from among the plurality of sample points, until the fixed-size buffer is full, the system further comprising:
   a logic unit for continuing the compressing into a fixed-size buffer for additional sample data read from at least another sample point;
   a logic unit for calculating compression ratios for the sample data read from the sample points; and
   a logic unit for calculating an estimated compression ratio for the data stream based on the calculated compression ratios for the sample data.

13. The method of claim 11, wherein the locality is defined by compressing fixed-size sample data read from one or more of the plurality of sample points, wherein the fixed-size is the same for all of the sample points, the system further comprising:
   a logic unit for calculating one or more compression ratios for one or more sample data read from one or more of the plurality of sample points; and
   a logic unit for calculating an estimated compression ratio for the data stream based on the calculated compression ratios for the one or more sample data.

14. The method of claim 12, wherein the compression ratio for sample data read from a sample point is calculated by dividing size of the fixed-size buffer by size of the data read from the sample point.

15. The method of claim 12, wherein the estimated compression ratio for the data stream is calculated by determining the average compression ratio for at least two of the sample points from among said plurality of sample points.

16. A computer program product comprising a non-transitory data storage medium having a computer readable program embedded therein, wherein the computer readable program when executed on a computer causes the computer to:
   select a plurality of sample points in a data stream to compress sample data selected at said sample points according to a first compression method; and
   compute an average compression ratio contribution over the selected plurality of sample points,
   wherein compression ratio contribution of a sample point is determined based on the first compression method and data in locality of the sample point, and
   wherein the locality for the sample point is defined by locations in the data stream, such that said locations potentially affect the sample point's contribution to the compression ratio.

17. The computer program product of claim 16, wherein the locality is defined by compressing into a fixed-size buffer, the sample data read from a sample point from among the plurality of sample points, until the fixed-size buffer is full,
   where the compressing into a fixed-size buffer continues for additional sample data read from at least another sample point;
   wherein compression ratios for the sample data read from the sample points are calculated; and
   wherein an estimated compression ratio for the data stream is calculated based on the calculated compression ratios for the sample data.

18. The computer program product of claim 16, wherein the locality is defined by compressing fixed-size sample data read from one or more of the plurality of sample points, wherein the fixed-size is the same for all of the sample points,
   wherein one or more compression ratios are calculated for one or more sample data read from one or more of the plurality of sample points; and
   wherein an estimated compression ratio is calculated for the data stream based on the calculated compression ratios for the one or more sample data.

19. The computer program product of claim 17, wherein the compression ratio for sample data read from a sample point is calculated by dividing size of the fixed-size buffer by size of the data read from the sample point.

20. The computer program product of claim 17, wherein the estimated compression ratio for the data stream is calculated by determining the average compression ratio for at least two of the sample points from among said plurality of sample points.

* * * * *